United States Patent [19]
Blaker et al.

[11] Patent Number: 5,465,275
[45] Date of Patent: Nov. 7, 1995

[54] EFFICIENT UTILIZATION OF PRESENT STATE/NEXT STATE REGISTERS

[75] Inventors: David M. Blaker, Emmaus; Marc S. Diamondstein, Allentown; Gregory S. Ellard, Forest Park; Mohammad S. Mobin, Whitehall; Homayoon Sam, Wescosville; Mark E. Thierbach, South Whitehall Township, Lehigh County, all of Pa.

[73] Assignee: AT&T IPM Corp., Coral Gables, Fla.

[21] Appl. No.: 153,334

[22] Filed: Nov. 16, 1993

[51] Int. Cl.⁶ .................................................. H04L 27/06
[52] U.S. Cl. ........................... 375/341; 371/40.4; 371/43
[58] Field of Search ........................ 375/39, 94; 371/30, 371/37.1, 40.1, 40.4, 43

[56] References Cited

U.S. PATENT DOCUMENTS

| | | | |
|---|---|---|---|
| 4,493,082 | 1/1985 | Cumberton et al. | 371/43 |
| 4,583,078 | 4/1986 | Shenoy et al. | 340/347 DD |
| 4,748,626 | 5/1988 | Wong | 371/30 |
| 4,868,830 | 9/1989 | Pollara-Bozzola | 371/43 |
| 5,272,706 | 12/1993 | Park | 371/43 |
| 5,291,524 | 3/1994 | Itakura et al. | 371/43 |

FOREIGN PATENT DOCUMENTS 0127984  12/1984  European Pat. Off. .......... H04L 1/10

Primary Examiner—Stephen Chin
Assistant Examiner—Don N. Vo
Attorney, Agent, or Firm—David L. Smith

[57] ABSTRACT

In accordance with the present invention, a technique for efficiently utilizing memory in determining which next state accumulated cost to retain, such as in a communication system or a Viterbi decoder. The system includes a memory having a portion of registers allocated to a first array and a portion of registers allocated to a second array. The technique includes retrieving a present state accumulated cost from a storage register of the first array and calculating a next state accumulated cost based on the present state accumulated cost. The next state accumulated cost is stored in a storage register of the second array. The second array is designated as containing present state accumulated costs. A present state accumulated cost is retrieved from a storage register of the second array and used in calculating a subsequent next state accumulated cost. The subsequent next state accumulated cost is stored in a storage register of the first array.

3 Claims, 2 Drawing Sheets

EFFICIENT UTILIZATION OF PRESENT STATE/NEXT STATE REGISTERS

CROSS-REFERENCE TO RELATED APPLICATIONS

This application is related to the following concurrently filed, copending applications, each of which is incorporated herein by herein by reference:

application Ser. No. 08/15231, entitled "Variable Length Tracebacks", filed Nov. 16, 1993, by D. Blaker, G. Ellard, and M. Mobin, our docket number Blaker 4-4-4;

application Ser. No. 08/153335, entitled "Power and Time Saving Initial Tracebacks", filed Nov. 16, 1993, by D. Blaker, G. Ellard, and M. Mobin, our docket number Blaker 6-6-6;

application Ser. No. 08/152805, entitled "Digital Receiver with Minimum Cost Index Register", filed Nov. 16, 1993, by D. Blaker, G. Ellard, M. Mobin and H. Sam, our docket number Blaker 2-2-2-3;

application Ser. No. 08/153405, entitled "Digital Processor and Viterbi Decoder Having Shared Memory", filed Nov. 16, 1993, by M. Diamondstein, H. Sam and M. Thierbach, our docket number Diamondstein 1-2-8;

application Ser. No. 08/152807, entitled "Digital Signal Processor", filed Nov. 16, 1993, by D. Blaker, G. Ellard, M. Mobin, and M. Thierbach, our docket number Blaker 5-5-5-9; and application Ser. No. 08/153391, entitled "Digital Signal Processor", filed Nov. 16, 1993, by D. Blaker, G. Ellard and M. Mobin, our docket number Blaker 1-1-1.

TECHNICAL FIELD

This invention relates generally to decoders.

BACKGROUND OF THE INVENTION

A Viterbi decoder is a maximum likelihood decoder that provides forward error correction. Viterbi decoders are used to decode a sequence of encoded symbols, such as a bit stream. The bit stream can represent encoded information in a telecommunication system. Such encoded information can be transmitted through various media with each bit (or set of bits) representing a symbol instant. In the decoding process, the Viterbi decoder works back through a sequence of possible bit sequences at each symbol instant to determine which one bit sequence is most likely to have been transmitted. The possible transitions from a bit at one symbol instant, or state, to a bit at a next, subsequent, symbol instant or state is limited. Each possible transition from one state to a next state can be shown graphically and is defined as a branch. A sequence of interconnected branches is defined as a path. Each state can transition only to a limited number of next states upon receipt of the next bit (or set of bits) in the bit stream. Thus, some paths survive and other paths do not survive during the decoding process. By eliminating those transitions that are not permissible, computational efficiency can be achieved in determining the most likely paths to survive. The Viterbi decoder typically defines and calculates a branch metric associated with each branch and employs this branch metric to determine which paths survive and which paths do not survive.

A branch metric is calculated at each symbol instant for each possible branch. Each path has an associated metric, accumulated cost, that is updated at each symbol instant. For each possible transition, the accumulated cost for the next state is calculated as the lesser of the sum of the branch metric for the possible transitions and the path accumulated cost at the respective previous state.

Prior an decoders have used two arrays of registers in a predefined group of memory locations within random access memory to store the present state accumulated costs and next state accumulated costs. The registers of a first array were used to store the present state accumulated costs. As the accumulated costs were calculated for the next symbol instant, the present state accumulated costs were read from registers of the first array and used in the calculations. The calculated accumulated costs for the next symbol instant, or next state, were written to registers of a second array. After all of the accumulated costs for the next state were calculated, the next state accumulated costs were read from a register or location in the second array and written to a corresponding register or location in the first array. This transfer was made in preparation for decoding the next symbol in the bit stream through a subsequent series of calculations to update the accumulated costs at the next state. In this manner, current state accumulated costs were stored in registers of a first array. The next state accumulated costs were calculated and stored in registers of a second array. As a result, at each symbol instant, the operation of reading and writing the contents of the registers of the second array into corresponding registers of the first array was required. Depending on the number of branches, this required a large number of read/write operations. These data transfer operations decrease performance of the decoder both in terms of time lost in unproductive operations and in energy consumption, particularly, in battery powered devices such as mobile telephones.

A need remains in the an for an efficient way to calculate and store the accumulated costs that eliminates the unnecessary read and write operations to transfer the accumulated costs from registers of one array to registers of another array.

SUMMARY OF THE INVENTION

One aspect of the invention is a technique for efficiently utilizing memory in determining which next state accumulated cost to retain, such as in a communication system or a Viterbi decoder. The system includes a memory having a first set of registers allocated to a first array and a second set of registers allocated to a second array. The technique includes retrieving a present state accumulated cost from a register of the first array and calculating a next state accumulated cost based on the present state accumulated cost. The next state accumulated cost is stored in a register of the second array. The second array is then designated as containing present state accumulated costs. A present state accumulated cost is retrieved from a register of the second array and used in calculating a subsequent next state accumulated cost. The subsequent next state accumulated cost is stored in a register of the first array. An advantage of the invention is that such a technique should provide more efficient processing and simultaneously reduce power consumption, thereby extending battery life for battery powered devices.

DETAILED DESCRIPTION

Figure 1:
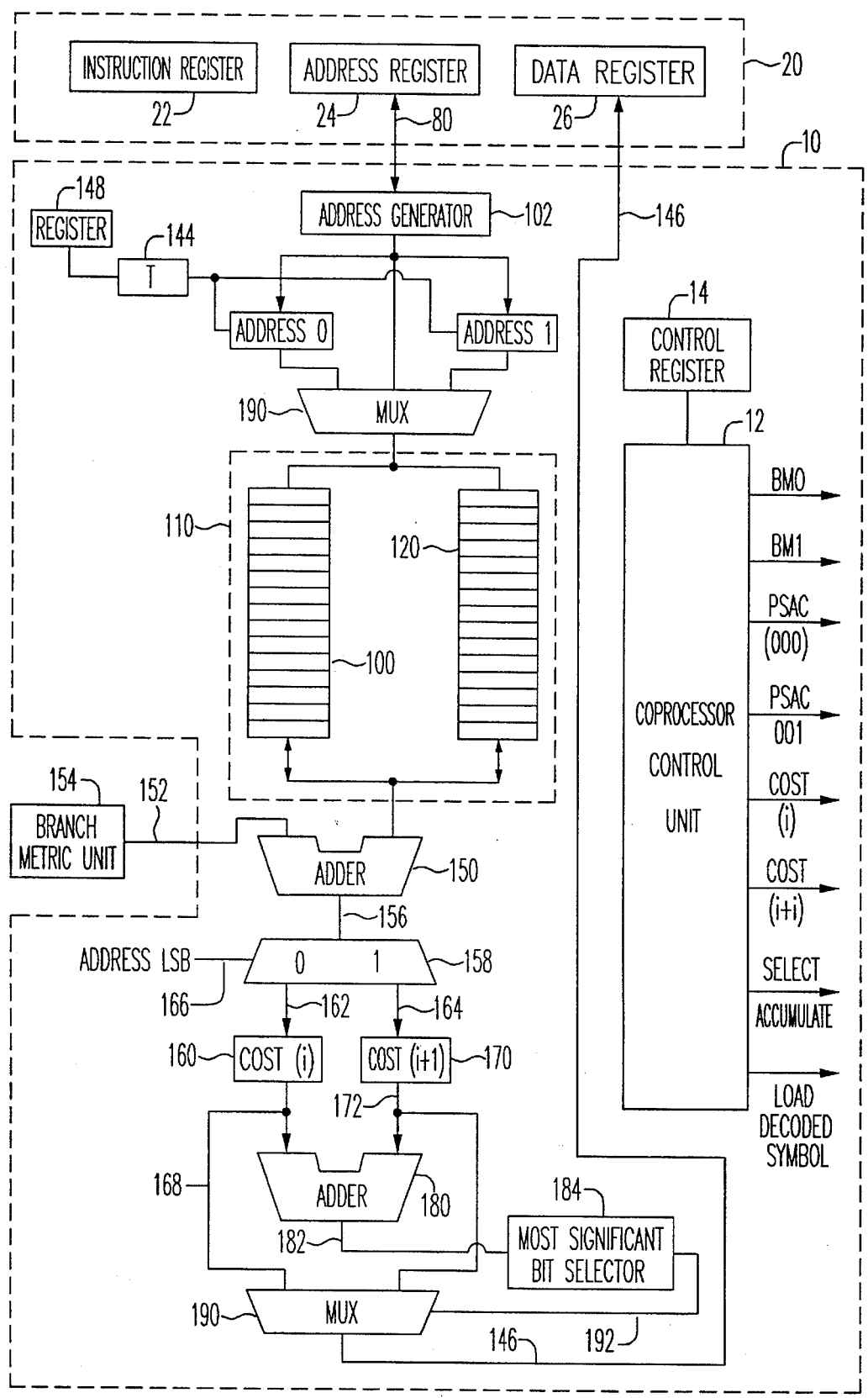
FIG. 1 is a simplified schematic diagram of an illustrated embodiment of the present invention in a digital signal processor as a coprocessor.

FIG. 1 shows an illustrative embodiment of the invention in a communication system such as a digital cellular telephone, modem, satellite communication system, or digital video communication system. In the illustrative embodiment of the invention, an error correction coprocessor 10 is controlled by a digital signal processor (DSP) 20. Error correction coprocessor 10 may be embedded within DSP 20. A portion of the registers of random access memory (RAM) 110 of the coprocessor is divided into two arrays 100 and 120. Data from registers of either array can be read from that array, processed by adder 150, registers 160 and 170 and adder 180, and resulting data written to registers of the other array. Address generator 102, in cooperation with flip flop 144, determines the array from which data is read as well as the array to which data is written.

An indirect addressing technique is used to write data to and read data from the error correction coprocessor. To write data to a register at an address in coprocessor 10, an address is written into address register 24 and the data is written to data register 26, both in DSP 20. The address is transferred from the DSP 20 to address generator 102 in coprocessor 10 on address bus 80 and is translated to a translated address of a corresponding register in the coprocessor that is dependent on the output of flip flop 144. Address generator 102 concatenates a bit dependent on the state of flip-flop 144. Methods are well known to concatenate either a most significant bit or a least significant bit to achieve an address translation. The data written to data register 26 is transferred from DSP 20 to the coprocessor memory location identified by the translated address.

To read data from a register at an address in coprocessor 10, an address is written into address register 24 of DSP 20. The address is transferred to address generator 102 and translated as set forth above. The data at the addressed register is read by reading data register 26.

The co-coprocessor control unit 12 generates a predetermined sequence of signals to control one aspect of operation of the coprocessor, the decoding function. From the disclosed operation of the illustrated embodiment, one of ordinary skill in the an can readily construct the signals produced by coprocessor control unit 12. Operation of the control unit is initiated by a single instruction transferred from the DSP to control register 14 in the manner described above.

Two arrays of memory 100 and 120 are identified in random access memory for storage of present state and next state accumulated costs. The binary representation of the present state and next state accumulated costs can take one of many forms. The forms include, but are not limited to: 2's-complement which may be sign extended; sign magnitude; floating point; or a simple binary representation. Each array consists of a plurality of addressable memory registers or locations. The number of memory registers in each array is sufficient to accommodate at least the greatest number of present state or next state costs required to be calculated. The number of memory registers used in each array may be less than the number of memory registers allocated for the array. For a constraint length C, the number of memory registers utilized in each array is $2^{C-1}$.

Arrays 100 and 120 have an associated address generator 102. Address generator 102 enables the memory registers from which data is read during a read operation, and also enables the memory location to which data is written during a write operation. Data bus 146 is coupled to and provides one of the inputs to adder 150 from the register enabled by the address translator. The second input to adder 150, input 152, is a branch metric provided by the branch metric unit 154. Each branch metric is needed only once and is calculated as required in any known manner. Output 156 from adder 150 is coupled to and provides the input to demultiplexer 158. The least significant bit of the address from which the cost is read provides the select input 166 to de-multiplexer 158. For even addresses, demultiplexer 158 provides the input 156 as output 162. For odd addresses, demultiplexer provides input 156 as output 164. Output 162 is coupled to and provides the input to register 160. Output 164 is coupled to and provides the input to register 170.

The output 168 of register 160 is coupled to and provides one of the inputs to adder 180. The output 172 of register of 170 is coupled to and provides the other input to adder 180. Adder 180 subtracts input 172 from input 168. Output 168 from register 160 and output 172 from register 170 are coupled to and provide the inputs to multiplexer 190. The most significant bit of output 182 is determined by most significant bit selector 184 and provided as the select input 192 to multiplexer 190. Select input 192 selects one of the inputs 168 or 172 to multiplexer 190 as its output to place on data bus 146.

In decoding encoded data using the Viterbi decoder from the series of binary data received at the decoder, the decoder reconstructs the sequence of data most likely transmitted. The received data may include errors. The initial state of the encoder is known so the decoder has a starting point. The end state of the encoder may also be known, and when known the decoder also has a predetermined ending point. The decoder must determine the most likely sequence of state transitions for the received series of binary data. Each such state represents a symbol instant. At each state or symbol instant, there are a number of states that range from zero up to $2^{C-1}-1$ where C is the constraint length. These $2^{C-1}$ states will be referred to as individual states. A limited number of transitions are possible. At each symbol instant, the accumulated cost is calculated and stored for each of the possible transitions.

At each symbol instant, each individual state in the illustrated embodiment of the invention can transition only to two possible next individual states. Concomitantly, each next individual state has only two possible previous individual states from which a transition to it can originate. Other decoders could have more than two transitions to a next state.

A branch metric is calculated at each symbol instant for each possible transition from one individual state to the next individual state. Various methods for calculating branch metrics are known in the an. The branch metric of both branches transitioning to a given next individual state are calculated, then added to the accumulated cost of the respective originating individual state, resulting in two potential accumulated cost sums. A comparison is made of the two potential accumulated cost sums. The lesser of the two sums is selected as the next state accumulated cost. The transition corresponding to the lesser sum is the more likely transition from the two possible originating individual states to the given next individual state. The originating individual state of the more likely transition is stored as the surviving origin of a branch to the given next individual state. The lesser sum is the accumulated cost of the next individual state and replaces the accumulated cost for that individual state. This process is repeated for each of the next individual states and repeated also for each symbol instant until all symbols in the bit stream are decoded.

Figure 2:
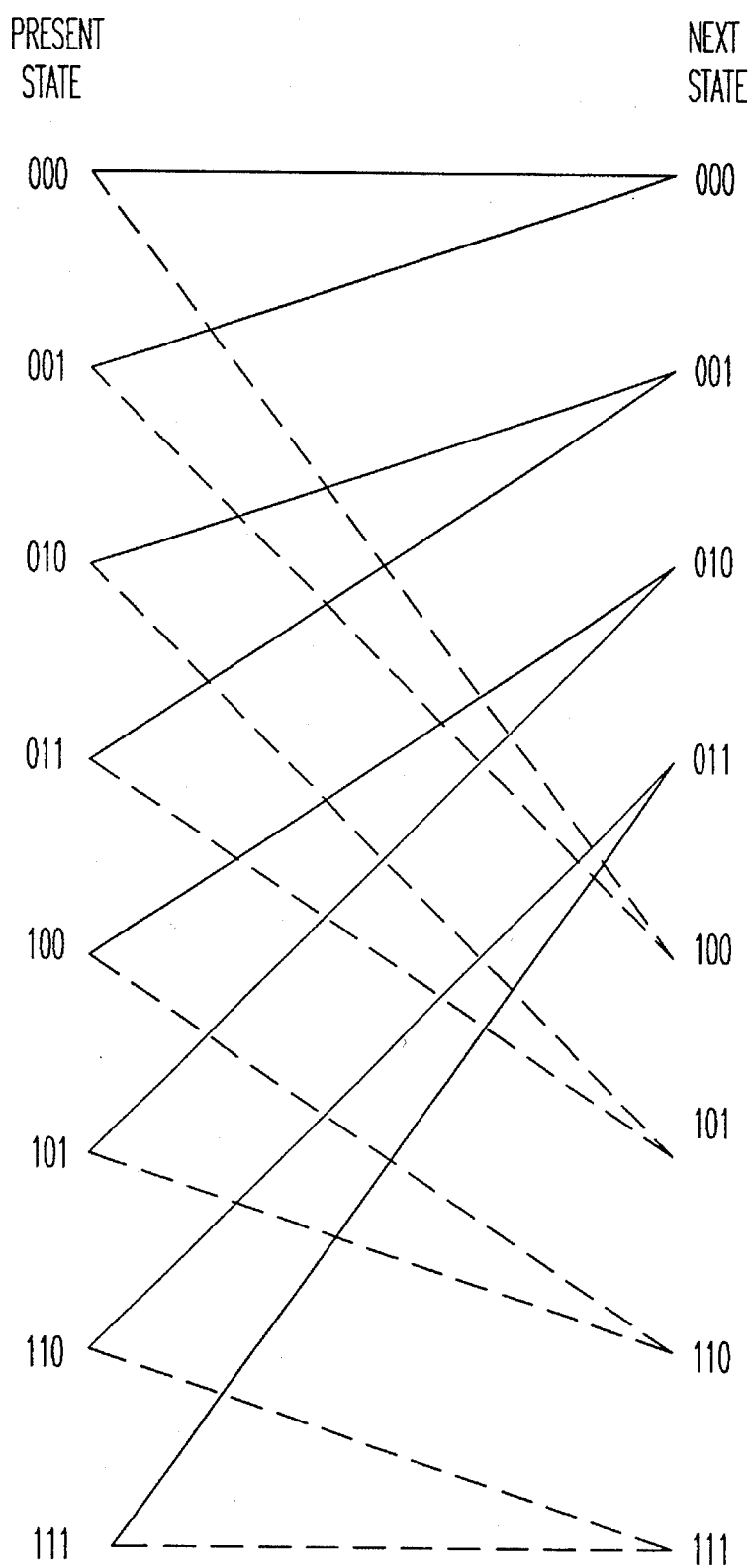
FIG. 2 is a state transition diagram for a constraint length of four.

By way of example, for a constraint length of four, there are $2^{4-1}$, or eight, individual states. A state transition diagram is shown in FIG. 2. The solid lines represent a transition to the next state when the next bit in the series is a zero, and a broken line represents a transition to the next state when the next bit in the series is a one. The equations for calculating the next state accumulated costs for each of the eight individual states of FIG. 2 are shown in Table 1.

$$NSAC(000)=Lesser\{PSAC(000)+BM(000),PSAC(001)+BM(001)\}$$

$$NSAC(001)=Lesser\{PSAC(010)+BM(010),PSAC(011)+BM(011)\}$$

$$NSAC(010)=Lesser\{PSAC(100)+BM(100),PSAC(101)+BM(101)\}$$

$$NSAC(011)=Lesser\{PSAC(110)+BM(110),PSAC(111)+BM(111)\}$$

$$NSAC(100)=Lesser\{PSAC(000)+BM(000),PSAC(001)+BM(001)\}$$

$$NSAC(101)=Lesser\{PSAC(010)+BM(010),PSAC(011)+BM(011)\}$$

$$NSAC(110)=Lesser\{PSAC(100)+BM(100),PSAC(101)+BM(101)\}$$

$$NSAC(111)=Lesser\{PSAC(110)+BM(110),PSAC(111)+BM(111)\}$$

TABLE 1

Next State Accumulated Cost Equations

Although the same symbol has been used for the branch metric in the upper half and lower half of the table, it is understood that different numerical quantities are represented. In the exemplary illustration, the branch metric in the upper half of Table 1 is due to receipt of a zero whereas the branch metric in the lower half of the Table 1 is due to receipt of a one.

The next state accumulated cost for individual state 000, NSAC(000), is the lesser of the present state accumulated cost for individual state 000, PSAC(000), and the branch metric for branch 000, BM(000), or the present state accumulated cost for state 001, PSAC(001) and the branch metric for branch 001, BM(001). Similarly the next state accumulated cost for state 001, NSAC(001), is the lesser of the present state accumulated cost for state 010, PSAC(010), and the branch metric for branch 010, BM(010), or the present state accumulated cost for state 011, PSAC(011) and the branch metric for branch 011, BM(011). This calculation is repeated for all individual states until all next state costs are calculated at a given symbol instant. Calculation of the next state accumulated cost are achieved utilizing the circuit of FIG. 1. The present state accumulated costs are stored in array 100, for example starting at the first memory location (e.g. address 000) therein, and may be initialized with the first memory location having a value of zero and subsequent memory locations having a very large negative value. With the output 142 of toggle flip-flop 144 in a state determined by register 148, the output 142 of flip-flop 144 determines that present state accumulated cost data is to be read from array 100.

Address generator 102 generates an address and enables the register identified by the address to be read. A read operation transfers the accumulated cost for state 000 from a memory register in array 100 to the data bus 146. Data bus 146 provides one operand input to adder 150. The other input to adder 150 is the branch metric for branch 000, as calculated by the branch metric unit 154. The sum output from adder 150 provides the input to de-multiplexer 158. Since the least significant bit of the address of the present state accumulated cost was zero, de-multiplexer 158 selects output 162 and provides the output 156 from adder 150 as the input to register 160. Output 162 is transferred to and stored temporarily in register 160. This sum will be referred to as COST(i).

Address generator 102 then generates the address (e.g. address 001) of the accumulated cost for state 001 and enables that memory register to be read. Typically, the accumulated costs will be stored in sequential memory registers. The value of accumulated cost for state 001 is read from its memory register in array 100 by data bus 146, and provided as an input to adder 150. The other input, provided by the branch meuic unit 154, is the calculated branch metric for state 001. The sum output from adder 150 provides the input to de-multiplexer 158. Since the least significant bit of the address of the present state accumulated cost was one, demultiplexer 158 selects output 172 and provides the output 156 from adder 150 as the input to register 170. Output 164 is transferred to and stored temporarily in register 170, and will be referred to as COST(i+1).

The lesser of these two sums, COST(i) and COST(i+1), is selected to replace the present state accumulated cost for state 000 and represents the accumulated cost at the next state. The lesser of COST(i) and COST(i+1) is determined by comparing the two sums and selecting the smaller one. COST(i) provides one input operand to adder 180; the other input operand is COST(i+1). Adder 180 subtracts COST(i) from COST(i+1), providing output 182 as the difference therebetween. If COST(i+1)is greater than COST(i), the most significant bit of output 182 will be 1 representing a negative sign. Otherwise, the most significant bit will be 0. Most significant bit selector 184 selects the most significant bit of output 182 and provides the most significant bit as output 192. Output 192 is the select input to multiplexer 190. The select input determines which accumulated cost input, input 168 or input 172, to multiplexer 190 is selected as the lesser cost and is provided to data bus 146. When COST(i+1) is greater than COST(i), the most significant bit is 1 causing multiplexer 190 to select input 168, which is the smaller input to adder 180, to place on data bus 146. Otherwise, the most significant bit is 0 causing multiplexer 190 to select input 168, which is COST(i),to place on data bus 146. In this manner, adder 180 and most significant bit selector 184 function as a comparator to select the smaller accumulated cost, COST(i) or COST(i+1), and provide that smaller accumulated cost to data bus 146. Address generator 102 enables a register in the array designated as the next state array. When array 100 is designated the present state array, data on data bus 146 is read to a memory register in array 120 identified by address generator 102. Typically, the next state accumulated cost stored in a register of array 120 is stored in a register corresponding to the register of the present state accumulated cost for the same individual state in array 100. Each register in the present state array is accessed twice in calculating the next state accumulated costs stored in the next state array.

The next state accumulated cost for individual state 001 is calculated. A read operation transfers the accumulated cost for individual state 010 from the memory register (e.g. address 010) enabled by address generator 102 in array 100 to data bus 146. Data bus 146 provides one input operand to adder 150. The branch metric unit 154 calculates and provides the branch metric for branch 010 as the other input operand to adder 150. The sum output from adder 150 provides the input to de-multiplexer 158. Since the least significant bit of the address of the present state accumulated cost was one, de-multiplexer 158 selects output 162 and provides the output 156 from adder 150 as the input to register 160. Output 162 is transferred to and stored temporarily in register 160 as COST(i).

The address of a register containing the accumulated cost for individual state 011 is generated (e.g. address 011) and enabled by address generator 102. The value of accumulated cost for individual state 011 is read from its memory register in array 100 and is provided as an input to adder 150. The other input to adder 150 is the calculated branch metric for state 011 provided by the branch metric unit 154. The sum output from adder 150 provides the input to de-multiplexer 158. Since the least significant bit of the address of the present state accumulated cost was one, demultiplexer 158 selects output 192 and provides the output 156 from adder 150 as the input to register 170. Output 164 is transferred to and stored temporarily in register 170 as COST(i+1).

The lesser of COST(i) and COST (i+1) is selected to replace the present state accumulated cost for state 001. Adder 180 subtracts COST(i+1) from COST(i), the most significant bit selector 184 provides the most significant bit as the select input to multiplexer 190. Multiplexer 190 selects the lesser of COST(i) and COST (i+1) and provides the lesser cost to data bus 164. As described above, a memory register in array 120 is enabled by address generator 102 and the next state accumulated cost is written to the register. The memory register in array 120 where the next state accumulated cost is written typically corresponds to the register location in array 100 in which the present state cost of individual state 001 was stored. This process is repeated until all of the accumulated costs have been calculated for the individual states such that there is a next state accumulated cost stored in registers in array 120 for each present state accumulated cost stored in registers in array 100.

The state of register 148 is changed to toggle the output of flip-flop 144. At this point, a debugging capability can be invoked to access whether the next state accumulated costs are accurate. Data is transferred between DSP 20 and coprocessor 10 by way of a data register 24. DSP 20 can read from or write to any of the memory registers of coprocessor 10. Memory registers of the coprocessor are indirectly addressed by placing a memory register address in address register 24 of DSP 10. Address generator 102 receives the address from address register 24 on address bus 80. In a read operation, coprocessor 10 then transfers the contents of the addressed coprocessor memory register to the receive data register where it can be read by DSP 20. Through a sequence of such operations, the entire array of present state accumulated costs, as well as the entire array of next state accumulated costs, and the state of register 148 can be transferred to DSP 20.

As a debugging tool, DSP 20 can independently calculate the branch metric values and the next state accumulated costs. DSP 20 can compare the DSP calculated next state accumulated costs to the coprocessor calculated next state accumulated costs to independently determine if the next state accumulated costs were accurately calculated in the coprocessor. If the next state accumulated costs are accurate, the coprocessor proceeds to decode the next symbol in the bit stream. If a discrepancy exists between the next state accumulated costs, as calculated by the DSP and the coprocessor, the state of register 148 is reversed by the DSP writing the new state to data register 26 and entering the address of register 148 in address register 26. This toggles flip flop 144. The coprocessor will then recalculate the next state accumulated costs for each individual sitate as described above. When recalculating the next state accumulated costs, the coprocessor reads the present state accumulated costs from registers of array 100 and writes the next state accumulated costs to registers of array 120. The newly calculated next state accumulated costs may or may not be checked for accuracy.

The decoder is then ready to decode the next symbol. The contents of the registers of array 120 could be sequentially read then written to corresponding registers in array 100 to permit always having array 100 designated as the present state accumulated cost array and array 120 designated as the next state accumulated cost array. However, in accordance with the present invention, once the next state accumulated costs are calculated, the designation of the two arrays are reversed. Each symbol instant, the designation of the two arrays is reversed thereby enhancing computational efficiency of the accumulated costs by obviating the need to copy the next state accumulated costs from registers of one array to registers of the other array. Reversing the designation of to the arrays permits overwriting data that has no further value.

Reversing the designation and hence the function of the two arrays is achieved by changing the state of register 148. Changing the state of register 148 toggles flip flop 144 which reverses the bit concatenated to each address.

To calculate the next state accumulated costs, address generator 122 generates an address (e.g. address 000) and enables the addressed memory register to be read. The read operation transfers the accumulated costs for state 000 from the addressed memory register in array 120 to data bus 146. Data bus 146 provides one input to adder 150. The other input to adder 150 is the branch metric for branch 000, as calculated by the branch metric unit 154. The sum output from adder 150 provides the input to de-multiplexer 158. Since the least significant bit of the address of the present state accumulated cost was zero, de-multiplexer 158 selects output 162 and provides the output 156 from adder 150 as the input to register 160. Output 162 is transferred to and stored temporarily in register 160 as COST(i).

Address generator 102 then generates the address (e.g. address 001) of the accumulated cost for state 001 and enables that memory register to be read. The value of accumulated costs for state 001 is read from its memory register in array 120 by and provided as an input to adder 150. The other input, provided by the branch metric unit 154, is the calculated branch metric for individual state 001. The sum output from adder 150 provides the input to de-multiplexer 158. Since the least significant bit of the address of the present state accumulated cost was one, demultiplexer 158 selects output 172 and provides the output 156 from adder 150 as the input to register 170. Output 164 is transferred to and stored temporarily in register 170 as COST(i+1).

The lesser of these sums, COST(i) or COST(i+1), is selected to replace the present state accumulated cost for state 000 as described above. The smaller of COST(i) or COST (i+1) is provided to data bus 164 by multiplexer 190. The calculated next state accumulated cost is written to a memory register in the array designated as the next state array. When array 120 is designated as the present state array, the calculated next state accumulated cost is written to a memory location in array 100 enabled by address generator 102. Typically, the next state accumulated cost stored in array 100 is stored in a register corresponding to the location of a register in array 120 that contains the accumulated cost for the same individual state. The address generator increments and the next state accumulated cost for individual state 001 is calculated. The next state accumulated cost calculations continue until all of the next state accumulated cost have been calculated for each of the individual states. The state of register 148 is changed to toggle the output of flip-flop 144. Should the debugging capability be invoked at this symbol instant, the present state accumulated costs are transferred from array 120 to data register 26 in the DSP and the next state accumulated costs are transferred from array 100 to the DSP.

The decoder is ready to decode the next symbol. The designation of the two coprocessor memory arrays is reversed relative to the previous symbol instant. This was achieved by changing the state of register 148 which, as described above, toggles flip-flop 144. This causes present state accumulated costs for individual states to be read from register of array 100 again, and correspondingly the next state accumulated costs to be written to registers of array 120 again. After the next state accumulated cost for all individual states is calculated, flip-flop 144 again toggles. Thus, at the conclusion of calculating the next state accumulated costs at each symbol instant, which array of accumulated costs is considered the present state array and which array is considered the next state array is reversed until all symbols in the bit stream have been decoded. In this manner, registers of a first array originally contain the present state accumulated costs. The next state accumulated costs are calculated and written to registers of a second array. At the next symbol instant, the next state becomes the present state, and the former next state accumulated costs in the second array become the present state costs for the purpose of calculations at the next symbol instant. The former present state costs in the first array are overwritten by using the first array to store the calculated next state accumulated costs. In this manner, designation of which of the two arrays is the present state array, containing present state accumulated costs, and which array is the next state array, containing next state accumulated costs, is cyclical, alternating from the first array to the second array and back to the first array. This array designation alternates until all of the symbols in the bit stream have been decoded.

The invention is particularly useful in communication systems and equipment employing integrated circuits including this technique. Such communications systems and equipment has the advantages of reducing power consumption and saving time. In one respect, these advantages are achieved by not needlessly reading the contents of registers in one array and writing them to registers of a second array.

While the illustrative embodiment of the invention has not been described as incorporating pipelining, one skilled in the an would recognize the enhanced computational efficiency available by utilizing pipelining in the design. Pipelining is achieved by initiating computation with a new data set before completing computations with a previous set of data. The more latches used in pipelining, the greater the depth of pipelining. Pipelining causes an initial latency in computation time required to fill the pipeline, but maximizes usage of resources such as adders and subtractors.

We claim:

1. In a Viterbi decoder for determining the next state accumulated cost for each possible transition at a series of symbol instants, said decoder including memory having a portion allocated to a first array and a portion allocated to a second array, a method for determining which next state cost to retain, comprising the steps of:

retrieving an accumulated cost associated with a first present state from a first storage register of a first array, the first storage register of the first array capable of being any storage register in the first array;

adding the accumulated cost associated with a first present state to a first to branch metric resulting in a first potential accumulated cost;

retrieving an accumulated cost associated with a second present state from a second storage register of the first array;

adding the accumulated cost associated with the second present state to a second branch metric resulting in a second potential accumulated cost;

subtracting one of the first and second potential accumulated costs from the other resulting in a difference;

identifying in a bit representation of the difference a most significant bit;

determining the smaller of the first and second potential accumulated costs as the next state accumulated cost by the most significant bit of the difference;

storing the next state accumulated cost in a storage register of a second array;

designating the second array as containing present state accumulated costs;

calculating a subsequent next state accumulated cost based on an accumulated cost from the second array; and storing the subsequent next state accumulated cost in a storage register of the first array.

2. In a Viterbi decoder for determining the next state accumulated cost for each possible transition at a series of symbol instants, said decoder including memory having a portion allocated to a first array and a portion allocated to a second array, a method for determining which next state cost to retain, comprising the steps of:

retrieving an accumulated cost associated with a first present state from a first storage register of a first array, the first storage register of the first array capable of being any storage register in the first array;

adding the accumulated cost associated with a first present state to a first branch metric resulting in a first potential accumulated cost;

retrieving an accumulated cost associated with a second present state from a second storage register of the first array;

adding the accumulated cost associated with the second present state to a second branch metric resulting in a second potential accumulated cost;

subtracting one of the first and second potential accumulated costs from the other resulting in a difference:

representing the difference as a sequence of bits;

identifying one of the bits as a most significant bit;

selecting one of the first and second potential accumulated costs as the next state accumulated cost by the most significant bit of the difference;

storing the next state accumulated cost in a storage register of a second array;

designating the second array as containing present state accumulated costs;

calculating a subsequent next state accumulated cost based on an accumulated cost from the second array; and storing the subsequent next state accumulated cost in a storage register of the first array.

3. A method for determining the next state accumulated cost as recited in claim 2, wherein the step of selecting one of the first and second potential accumulated costs as the next state accumulated cost by the most significant bit of the difference, comprises:

selecting the smaller of the first and second potential accumulated costs as the next state accumulated cost.

* * * * *